United States Patent
Tomita et al.

[11] Patent Number: 5,958,138
[45] Date of Patent: Sep. 28, 1999

[54] GAS RECOVERY UNIT

[75] Inventors: Shinji Tomita, Hyogo-ken; Shigeyoshi Nozawa, Osaka, both of Japan

[73] Assignee: Teisan Kabushiki Kaisha, Tokyo, Japan

[21] Appl. No.: 08/743,188

[22] Filed: Nov. 5, 1996

[30] Foreign Application Priority Data

Nov. 6, 1995 [JP] Japan .................................. 7-287143

[51] Int. Cl.$^6$ .................................................. C23C 16/00
[52] U.S. Cl. ........................ 118/715; 62/48.2; 62/614; 62/616
[58] Field of Search ................ 118/715; 62/48.2, 62/614, 616

[56] References Cited

U.S. PATENT DOCUMENTS

| | | |
|---|---|---|
| 4,549,889 | 10/1985 | Yamazaki . |
| 5,250,323 | 10/1993 | Miyazaki .............................. 427/255.1 |
| 5,426,945 | 6/1995 | Menzenski .................... 62/11 |

FOREIGN PATENT DOCUMENTS

| | | |
|---|---|---|
| 0 174 673 | 3/1986 | European Pat. Off. . |
| 0 334 664 | 9/1989 | European Pat. Off. . |
| 0 665 305 | 8/1995 | European Pat. Off. . |
| 32 07 065 | 9/1983 | Germany . |

Primary Examiner—Bruce Breneman
Assistant Examiner—Enh Fieler
Attorney, Agent, or Firm—Burns, Doane, Swecker & Mathis, L.L.P.

[57] ABSTRACT

Provided is a gas recovery unit which is more efficient in its recovery and less expensive to run. The gas recovery unit comprises a CVD device, an exhaust gas recovery part and an exhaust gas purification part. The exhaust gas recovery part is constructed so as to have an inert gas reservoir part capable of accommodating liquid nitrogen, to have an exhaust gas supply part for supplying an exhaust gas to said inert gas reservoir part so that it can be brought in gasliquid contact with the liquid nitrogen, and to have a recovered and liquefied gas discharge part for discharging the recovered and liquefied gas which has been liquefied in the inert gas reservoir part. The exhaust gas purification part is constructed so as to have a recovered and liquefied gas reception part, an evaporator and a condenser for carrying out a heat exchange between said liquid nitrogen and the recovered and liquefied gas which has been evaporated, and cleaning gas recovery parts, and to have a cooling inert gas discharge part, wherein the cooling inert gas discharge part is connected to the inert gas supply path.

10 Claims, 2 Drawing Sheets

GAS RECOVERY UNIT

BACKGROUND OF THE INVENTION

1. Field of the Invention

The present invention relates to a gas recovery unit, in which a CVD device is provided which has a gas introduction part having an inert gas supply path for supplying a diluting inert gas and a cleaning gas supply path for supplying a cleaning gas, each connected thereto. The unit also has an exhaust gas discharge part for releasing an exhaust gas, and an exhaust gas recovery part for cooling down and recovering said cleaning gas from the exhaust gas from said CVD device and an exhaust gas purification part for purifying the liquefied and recovered exhaust gas. The present invention also relates to a gas recovery unit in which an etching device (A) is provided which has a gas introduction part having an inert gas supply path for supplying a diluting inert gas and an etching gas supply path for supplying an etching gas, each connected thereto. The unit also has an exhaust gas discharge part for releasing an exhaust gas, and an exhaust gas recovery part for cooling down and recovering said etching gas from the exhaust gas from said etching device and an exhaust gas purification part for purifying the liquefied and recovered exhaust gas.

2. Description of the Prior Art

In a gas recovery unit, in which a CVD device is provided which has a gas introduction part having an inert gas supply path for supplying a diluting inert gas and a cleaning gas supply path for supplying a cleaning gas, each connected thereto, and which has an exhaust gas discharge part (A7) for releasing an exhaust gas, it is necessary to remove, from said CVD device, foreign matters generated therein such as silicon dioxide ($SiO_2$), polysilicon, silicon nitride, metal silicide and amorphous silicon, because such foreign matters can have a detrimental influence upon the products. Accordingly, there has been hitherto carried out such a cleaning method which comprises introducing a cleaning gas into said CVD device to convert said foreign matters to volatile substances, and removing these volatile substances. By introducing into said CVD device a compound which can be reacted with said foreign matters to convert said foreign matters to gaseous components, such as nitrogen trifluoride ($NF_3$) which converts silicon dioxide ($SiO_2$) to silicon fluoride ($SiF_4$), same has to be removed from the CVD device. The cleaning gas has also been often used in an amount larger than its necessary amount, and in such a case, this excess amount of the cleaning gas beyond the necessary amount will be mixed in said exhaust gas. When said cleaning gas is in particular harmful or expensive, it is desired that the cleaning gas be recovered for recycle use. Thus, various gas recovery units have been proposed.

Also, in using an etching device, in which an etching gas capable of being reacted, for example, with a semiconductor film or the like is brought into contact with said semiconductor film, thereby carrying out the etching, recovery of the etching gas for recycle use has been suggested.

There has been proposed as the exhaust gas recovery part of such a gas recovery unit a recovery part in which the cooler is constructed by providing a supply part for supplying cooling gas in a liquid state and a cooling gas circulation part which will be cooled down by heat of evaporation of said cooling gas. As the exhaust gas purification part of such a gas recovery unit, it has been suggested to construct one so that the recovered exhaust gas is purified by use of a rectification column having a condenser accommodating the cooling gas in a liquid state. Even if a gas recovery unit is designed which has the aforementioned exhaust gas recovery part and exhaust gas purification part, however, there are various problems. For example, various problems include the power required, the unit as a whole easily becoming larger in scale, the increased cost for operating the cooler and condenser, and the cooling efficiency becoming lower in relation to energy consumption because the cooler and condenser are comprised in such a way that the evaporated cooling gas is used as recycle by way of a compressor for liquefying the same gas again. Thus, it has been further proposed to use liquid nitrogen as said cooling gas.

In such a conventional gas recovery unit as discussed above, however, the design has been such that the nitrogen gas formed by the evaporation of liquid nitrogen is released for disposal to the atmosphere, although the cooling efficiency can be set relatively higher. Therefore, it has been pointed out that it is uneconomical to release the evaporated nitrogen gas for disposal to the atmosphere. Further, it is desired to improve the gas recovery unit so that the cleaning gas or etching gas can be more effectively recovered from the exhaust gas.

Due to the consideration of the aforementioned facts, it is therefore an object of the invention to provide a gas recovery unit in which the recovery efficiency of the cleaning gas or etching gas is greater and the running cost is less expensive.

SUMMARY OF THE INVENTION

According to the invention, there is provided a gas recovery unit as claimed. A CVD device is provided which has a gas introduction part having an inert gas supply path for supplying a diluting inert gas and a cleaning gas supply path for supplying a cleaning gas, each connected thereto. The device also has an exhaust gas discharge part for releasing an exhaust gas, and an exhaust gas recovery part for cooling down and recovering said cleaning gas from the exhaust gas from said CVD device and an exhaust gas purification part for purifying the liquefied and recovered exhaust gas. The diluting inert gas is comprised of a gas having a boiling point lower than that of said cleaning gas. The exhaust gas recovery part is constructed so as to have an inert gas reservoir part capable of accommodating a cooling inert gas having a boiling point lower than that of said cleaning gas in a liquid state, to have an exhaust gas supply part for supplying said exhaust gas to said inert gas reservoir part so that it can be brought in gas-liquid contact with said cooling inert gas, and to have a recovered and liquefied gas discharge part for discharging the recovered and liquefied gas which has been liquefied in said inert gas reservoir part. The exhaust gas purification part is constructed so as to have a recovered and liquefied gas receptor part provided for receiving the recovered and liquefied gas from said exhaust gas recovery part, to have an evaporator for evaporating said recovered and liquefied gas, a condenser for carrying out a heat exchange between the cooling inert gas in the liquid state consisting of the same composition as said diluting inert gas and said recovered and liquefied gas which has been evaporated, and cleaning gas recovery parts for recovering the cleaning gas which has been condensed in said condenser, and to have a cooling inert gas discharge part for discharging said cooling inert gas which has been evaporated, with the cooling inert gas discharge part being connected to said inert gas supply path.

According to a preferred embodiment of the invention, there is provided an etching device having a gas introduction part comprising an inert gas supply path for supplying a diluting inert gas and an etching gas supply path for supplying an etching gas, each connected thereto. The etching device also has an exhaust gas discharge part for releasing an exhaust gas, and an exhaust gas recovery part for cooling down and recovering said etching gas from the exhaust gas from said etching device and an exhaust gas purification part for purifying the liquefied and recovered exhaust gas. The diluting inert gas is comprised of a gas having a boiling point lower than that of the etching gas. The exhaust gas recovery part is constructed so as to have an inert gas reservoir part capable of accommodating a cooling inert gas having a boiling point lower than that of the etching gas in a liquid state, to have an exhaust gas supply part for supplying said exhaust gas to said inert gas reservoir part so that it can be brought in gas-liquid contact with said cooling inert gas, and to have a recovered and liquefied gas discharge part for discharging the recovered and liquefied gas which has been liquefied in said inert gas reservoir part. The exhaust gas purification part is constructed so as to have a recovered and liquefied gas reception part for receiving the recovered and liquefied gas from said exhaust gas recovery part; to have an evaporator for evaporating said recovered and liquefied gas, a condenser for carrying out a heat exchange between the cooling inert gas comprised of the same composition as said diluting inert gas and said recovered and liquefied gas which has been evaporated; etching gas recovery parts for recovering the etching gas which has been condensed in said condenser; and to have a cooling inert gas discharge part for discharging said cooling inert gas which has been evaporated, with the cooling inert gas discharge part being connected to said inert gas supply path.

According to another aspect of the invention, the gas recovery unit comprises a prepurification part for prerectifying said recovered and liquefied gas so that a miscellaneous gas having a boiling point lower than that of said cleaning gas or said etching gas is removed from the recovered and liquefied gas, and a miscellaneous gas discharge part for discharging said miscellaneous gas.

According to another aspect of the invention, there is provided a gas recovery unit comprising a miscellaneous gas supply part for supplying said miscellaneous gas from said prepurification part into gas-liquid contact with said cooling inert gas.

Preferably, the inert gas is nitrogen gas.

According to another aspect of the invention, the cleaning gas or said etching gas contains at least any one of nitrogen trifluoride ($NF_3$), any PFCs such as hexafluoroethane ($C_2F_6$), chlorine trifluoride ($ClF_3$), tetrafluoromethane ($CF_4$), trifluoromethane ($CHF_3$), sulfur hexafluoride ($SF_6$), hydrogen chloride (HCl) and chlorine ($Cl_2$).

BRIEF DESCRIPTION OF THE DRAWING

Various embodiments of the present invention will be described with reference to the Figures of the Drawing, wherein.

DETAILED DESCRIPTION OF THE PREFERRED EMBODIMENTS

Figure 1:
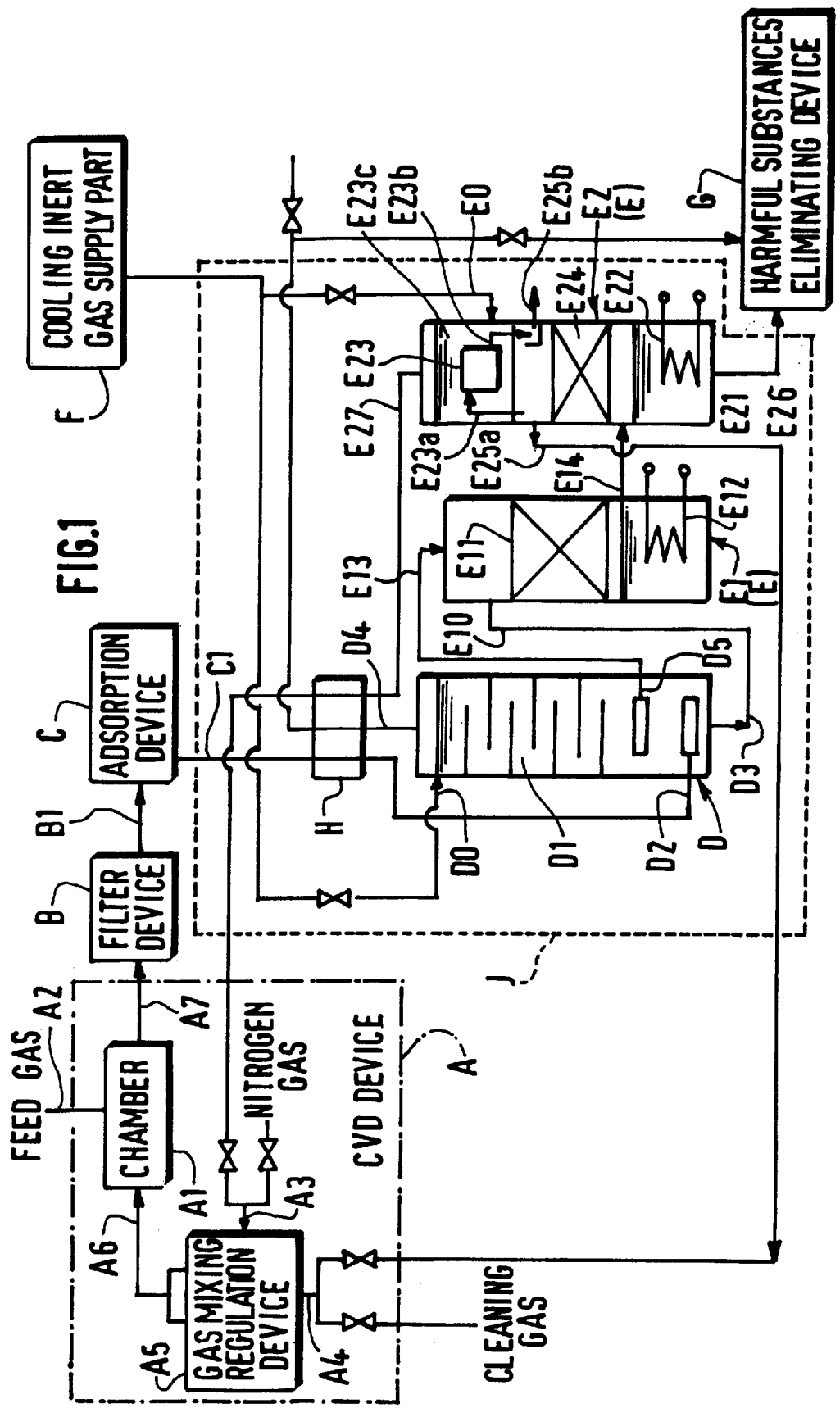
FIG. 1 is a schematic view of a gas recovery unit according to the present invention.

When an exhaust gas from a CVD device (etching device) is supplied to an inert gas reservoir part which can accommodate cooling inert gas comprised of a gas having a boiling point lower than that of cleaning gas (etching gas) in a liquid state so as to be capable of being brought in gas-liquid contact with said cooling inert gas, the cleaning gas (etching gas) in said exhaust gas is cooled down by said cooling inert gas and recovered into the cooling inert gas in a liquid state in the inert gas reservoir part. Owing to this construction, accordingly, an extremely high gas recovery efficiency of said exhaust gas is exhibited, as compared with the construction of a conventional exhaust gas recovery part using a cooling machine. In addition, said exhaust gas generally contains an excessive amount of the cleaning gas (etching gas) remaining in said CVD device (etching device) and a volatile component (hereinafter merely called a miscellaneous gas) generated in said CVD device (etching device).

The cleaning gas (etching gas) which has been recovered is then discharged as the recovered and liquefied gas from the recovered and liquefied gas discharge part and sent to the exhaust gas purification part. Although the recovered and liquefied gas easily gets mixed with said cooling inert gas and a miscellaneous gas component having a high boiling point, the exhaust gas purification part is constructed such that the recovered and liquefied gas is received and purified in the exhaust gas purification part, whereby only the cleaning gas (etching gas) can be recovered. Namely, the exhaust gas purification part is constructed such that the recovered and liquefied gas which has been received therein is evaporated by means of an evaporator and the recovered and liquefied gas which has been evaporated is condensed by means of a condenser, whereby the cleaning gas (etching gas) can be taken out of the recovered and liquefied gas. The miscellaneous gas component, having a high boiling point, can be removed as a liquid therefrom and said cooling inert gas can be removed as a gas therefrom.

Since the condenser is constructed so as to use cooling inert gas in a liquid state having the same composition as the diluting inert gas and to carry out a heat exchange cooling inert gas with the recovered and liquefied gas which has been evaporated, this cooling inert gas can be reused as a diluting inert gas for said CVD device (etching device) even if it is evaporated by the heat exchange with said cleaning gas (etching gas) in the recovered and liquefied gas. Further, since the cooling inert gas discharge part of the condenser is connected with the inert gas supply path of said CVD device (etching device), said cooling inert gas can be usefully utilized, not rejected.

There are some cases where the miscellaneous gas having a low boiling point in said exhaust gas can be eliminated as a gaseous component in said exhaust gas recovery part because it is not liquefied in the exhaust gas recovery part. If a prepurification part for prerectifying the recovered and liquefied gas to remove a miscellaneous gas having a boiling point lower than that of said cleaning gas or said etching gas from the recovered and liquefied gas is provided in said exhaust gas purification part, then in a case where it is desired to remove the miscellaneous gas having a boiling point with high precision so that the exhaust gas is purified, it becomes possible to remove the miscellaneous gas having a low boiling point from the miscellaneous gas discharge part of said prepurification part. This is useful for rendering a higher purity recovered and purified cleaning gas (etching gas) from an exhaust gas.

If the gas discharged from said miscellaneous gas discharge part can be further brought into gas liquid contact with the cooling inert gas in said exhaust gas recovery part, then in this case, it is possible to recover the cleaning gas (etching gas) again and to utilize the same gas effectively, even when the cleaning gas (etching gas) has been mixed in the gas discharged from said miscellaneous gas discharge part. Even if said cleaning gas (etching gas) is harmful, it is possible to harmful gas leaks into the atmosphere and thus it becomes possible to reduce the cost involved in eliminating said harmful gas.

By cooling down said cleaning gas (etching gas), without using the power of a compressor or the like, the exhaust gas can therefore be cooled down at a higher cooling efficiency, and said cleaning gas (etching gas) can be more reliably liquefied for recovery. Thus, even if said cleaning gas (etching gas) is harmful to the environment, the environment will seldom be detrimentally effected. In a case where said cleaning gas (etching gas) is expensive, it becomes further possible to decrease the running expense of said CVD device (etching device) because the utilization efficiency of said cleaning gas (etching gas) in the CVD device (etching device) becomes higher and the need of using a large amount of the cleaning gas (etching gas) becomes smaller.

Since said cooling inert gas is used as a diluting inert gas for the CVD device (etching device), it becomes possible to provide a gas recovery unit having such a simple construction that one inert gas supply facility system is merely provided. By utilizing an inert gas supply facility also as the supply facility for the cooling inert gas and the diluting inert gas, in addition, the operation expense can be reduced.

If said cleaning gas (etching gas) contains at least any one of nitrogen trifluoride ($NF_3$), hexafluoroethane ($C_2F_6$), chlorine trifluoride ($ClF_3$), tetrafluoromethane ($CF_4$), trifluoromethane ($CHF_3$), sulfur hexafluoride ($SF_6$), hydrogen chloride (HCl) and chlorine ($Cl_2$), it is possible to effectively evaporate foreign matter (a substance to be etched) in said CVD device (etching device), and to effectively operate the CVD device (etching device) even when a cleaning gas (etching gas) having a lower concentration is used, while realizing the advantages of restraining the amount of cleaning gas (etching gas) used, reducing the operation expense and easily using the cleaning gas (etching gas) in recycle.

Nitrogen gas is preferably used as said inert gas. This inert gas is preferable because nitrogen gas is cheaper, its boiling point is lower than that of the various cleaning gases (etching gases) mentioned above and a general usability is easily obtained.

Referring to the figures of the drawing, the symbols have the following indications:

A—CVD device, A3—inert gas supply path, A4—cleaning gas supply path, A7—exhaust gas discharge part, D—exhaust gas recovery part, D1—inert gas reservoir part, D2—exhaust gas supply part, D3—recovered and liquefied gas discharge part, D5—miscellaneous gas supply part, E—exhaust gas purification part, E1—prerectification part, E10—recovered and liquefied gas reception part, E13—miscellaneous gas discharge part, E22—evaporator, E23— condenser, E25a, b—cleaning gas recovery parts, E27—cooling inert gas discharge part.

As shown in FIG. 1, the gas recovery unit according to the present invention is constructed by successively connecting an exhaust gas recovery part D and an exhaust gas purification part E downstream of an exhaust gas discharge pipe A7 of a CVD device A by way of a filter device B and an adsorption device C. A discharge path E25 for the recovered cleaning gas, which has been purified by a condenser E23 of said exhaust gas purification part E, is connected with a cleaning gas supply path A4 of said CVD device A, and a cooling inert gas discharge part E27 for discharging the cooling inert gas which has been evaporated from said condenser E23 is connected with a diluting inert gas supply path A3 of said CVD device A.

By providing a cooling inert gas supply part F for supplying liquid nitrogen as the cooling inert gas to said exhaust gas recovery part D and as the cooling inert gas to the condenser of said exhaust gas purification part E, the gas recovery unit is constructed such that the cooling inert gas can be supplied. By connecting a low boiling point gas discharge path D4 for discharging a volatile gas component generated from said exhaust gas recovery part D and a high boiling point gas discharge path E26 for discharging a high boiling point gas in a liquid state generated from said exhaust gas purification part E in communication to a harmful substances eliminating device G, the gas recovery unit is constructed such that the exhaust gas to be released to the atmosphere is made harmless.

Said CVD device A comprises a chamber A1 for forming a silicon film which will be used in TFT liquid crystal or the like, and said chamber A1 has a feed gas introduction pipe A2 for a silicon film-forming feed gas, the diluting inert gas supply path A3 and the cleaning gas supply path A4 and further has a cleaning mixed gas introduction pipe A6 connected in succession to a gas mixing regulation device A5 for mixing 1% of nitrogen trifluoride ($NF_3$) as the cleaning gas into nitrogen gas as the diluting inert gas. Further, the chamber A1 is constructed such that various equipments, for example, a substrate carrier part (not shown) for mounting a substrate on which a silicon film is to be formed and a plasma generating part (not shown), are built therein and an exhaust gas discharge pipe A7 is provided for discharging an exhaust gas generated in said chamber A1.

Said filter device B is connected in succession to said exhaust gas discharge pipe A7, and comprises a filter (not shown) built therein for filtering the exhaust gas from said exhaust gas discharge pipe A7 to remove a solid component such as a silicon component double-produced in said CVD device A and having a discharge pipe B1 provided so that the solid component can be filtered from said exhaust gas and discharged downstream.

Said adsorption device C is connected in succession to said discharge pipe B1, and comprises an adsorption column (not shown) built therein for removing, by adsorption, gas components having boiling points higher than that of said nitrogen trifluoride ($NF_3$), such as moisture and carbon dioxide gas contained in the exhaust gas from said discharge pipe B1, and a discharge pipe C1 so that the high boiling point gases can be removed by adsorption from said exhaust gas and discharged downstream.

Said exhaust gas recovery part D is constructed so as to have an inert gas reservoir part D1 equipped with a cooling inert gas supply part D0 for supplying liquid nitrogen as said cooling inert gas in a liquid state, to have an exhaust gas supply part D2 connected in communication with said discharge pipe C1 for supplying said exhaust gas to said inert gas reservoir part D1 so that it can be brought into gas-liquid contact with the cooling inert gas, and to have a recovered and liquefied gas discharge part D3 for discharging a recovered and liquefied gas resulting from the liquefication of said exhaust gas in said inert gas reservoir part D1. The inert gas reservoir part D1 is constructed such that a plural stage type gas absorption part is provided therein to enhance the gas-liquid contact efficiency. In addition, a miscellaneous gas having a low boiling point which is not liquefied in said inert gas reservoir part D1 can be released from the low boiling point gas discharge path D4 to the atmosphere.

Said exhaust gas purification part E is composed of a prerectification part E1 and a main purification part E2. Said prerectification part E1 comprises a rectification column containing packings E11 charged therein. The rectification column has a reboiler E12 provided in its lower part, a recovered and liquefied gas reception part E10 for receiving the recovered and liquefied gas from said recovered and liquefied gas discharge part D3, and a miscellaneous gas discharge part E13 for causing an evaporated gas containing a miscellaneous gas having a low boiling point which has not been returned because of said packings to circulate to said exhaust gas recovery part D, where said discharge part E13 is connected in communication with a miscellaneous gas supply part D5 provided in said exhaust gas recovery part D.

Owing to the aforementioned construction, the recovered and liquefied gas in said prerectification part E1 is freed of the miscellaneous gas having a low boiling point and the liquid nitrogen in said exhaust gas recovery part D. Even if the miscellaneous gas discharged from said miscellaneous gas discharge part E13 contains the said nitrogen trifluoride ($NF_3$), it will be recovered in said exhaust gas recovery part D again.

The main purification part E2 comprises a rectification column having a recovered and liquefied gas supply part E21 for receiving the recovered and liquefied gas from said recovered and liquefied gas forwarding path E14, an evaporator E22 for evaporating the recovered and liquefied gas and a condenser E23 for carrying out a heat exchange between the cooling inert gas in a liquid state having the same composition as the diluting inert gas and the recovered and liquefied gas which has been evaporated. The column also contains packings E24 charged therein for rectifying the recovered and liquefied gas. Said rectification column also has a cleaning gas recovery part E25a for recovering the cleaning gas in a gaseous state which has been purified, a cleaning gas recovery part E25b for recovering the cleaning gas which has been condensed in said condenser E23, and a high boiling point gas discharge path E26 for discharging a miscellaneous gas having a high boiling point which has remained as a liquid component by rectification. The cleaning gas recovery part E25a is connected with said cleaning gas supply path A4 so that the recovered and purified nitrogen trifluoride ($NF_3$) can be used for the supply of a cleaning gas to said CVD device A, and the high boiling point gas discharge path E26 is connected with said harmful substances eliminating device G so that the miscellaneous gas having a high boiling point which has remained is sent to the harmful substances eliminating device. The condenser E23 is constructed such that a cooling space E23c is provided which has a reception path E23a for receiving the recovered and liquefied gas which has been evaporated and a recovered liquid take-out part E23b for sending the cleaning gas which has been condensed to said cleaning gas recovery part E25b, whereby nitrogen trifluoride ($NF_3$) can be recovered even in a liquid state. The condenser is further constructed so as to have a cooling inert gas supply E0 for supplying liquid nitrogen as the cooling inert gas from said cooling inert gas supply part and a cooling inert gas discharge part E27 for discharging the evaporated gas of said liquid nitrogen. Said cooling inert gas discharge part E27 is connected with said diluting inert gas supply path A3 so that the cooling inert gas which has been evaporated can be utilized in said CVD device A again.

Said harmful substances eliminating device G is constructed so as to apply high energy such as plasma or heat to the miscellaneous gas having a low boiling point from said exhaust gas recovery part D or to the miscellaneous gas having a high boiling point from said exhaust gas purification part E so that any nitrogen trifluoride ($NF_3$) remaining or mixed therein is completely decomposed. Thus, such miscellaneous gas can be rendered environmentally safe and released to the atmosphere.

Said exhaust gas recovery part D and said exhaust gas purification part E are accommodated in a thermally insulated vessel (cold box) J so as to be kept at low temperatures. A connection path between the discharge pipe C1 and exhaust gas supply path D2, said low boiling point gas discharge path D4 and a connection path between said inert gas discharge part E27 and diluting inert gas supply path A3 are made to intervene in a heat exchanger H for relieving an environmental difference in temperature among said CVD device A, filter device B and adsorption device C, said exhaust gas recovery part D and said exhaust gas purification part E.

In a case where a foreign matter is generated in said CVD device A and hence its cleaning or removal is required, owing to the aforementioned construction, the feed gas introduction pipe A1 of said CVD device A is closed, substrates in the CVD device are taken out and the supply of liquid nitrogen from said cooling inert gas supply part is started. After the exhaust gas recovery part D and exhaust gas purification part E are sufficiently cooled down, the cleaning mixed gas introduction pipe A6 is opened in said CVD device A so that cleaning mixed gas containing nitrogen trifluoride gas is introduced into said CVD device. Since said nitrogen trifluoride gas then reacts with said foreign matter to evaporate said foreign matter, the inside of said CVD device A is cleaned. At that time, an exhaust gas containing an excess of said nitrogen trifluoride gas easily flows through the exhaust gas discharge pipe A7 because said nitrogen trifluoride gas is used relatively in an excess amount. By removing from said exhaust gas any solid foreign matter by means of said filter device B and by removing a high boiling point component gas from said exhaust gas by means of said adsorption device C, said exhaust gas is easily made to be nitrogen gas containing only nitrogen trifluoride gas and low boiling point gas mixed therein. When the exhaust gas is caused to pass through the exhaust gas supply part D2 of said exhaust gas recovery part D, said exhaust gas is cooled down by liquid nitrogen so that the nitrogen trifluoride gas is condensed and collected in the lower portion thereof. Said nitrogen trifluoride is sent to the exhaust gas purification part E so as to be purified for re-use.

In addition, it has been demonstrated that 90% or more of the nitrogen trifluoride gas contained in the exhaust gas from said adsorption device C is recovered by said exhaust gas recovery part D and exhaust gas purification part E and can be used in recycle.

Figure 2:
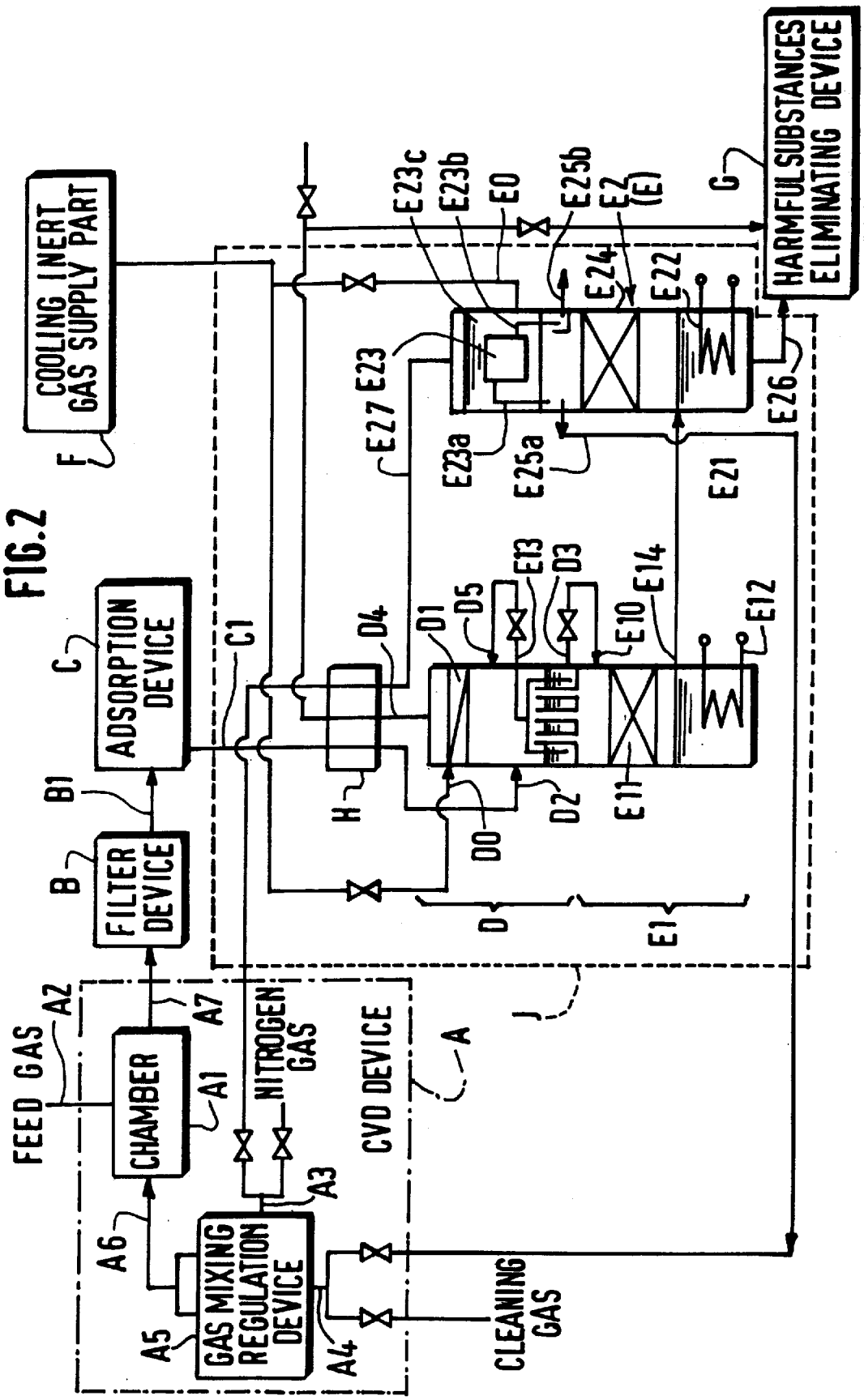
FIG. 2 is a schematic view of a gas recovery unit in another embodiment.

Said prerectification part E1 and said exhaust gas recovery part D may be formed as one body, as shown in FIG. 2. In said inert gas reservoir part D1, due to the construction shown in FIG. 2, liquid nitrogen and an exhaust gas will be brought in gas-liquid contact with each other in a plural stage type bubble column.

As to items having the same construction as the aforementioned embodiment described in FIG. 1, their explanation is omitted but the same marks are given in FIG. 2.

The diluting inert gas supply path A3 and cleaning gas supply path A4 may be satisfactorily provided in said chamber A1 so that the composition of a cleaning mixed gas to be supplied to said CVD device can be regulated, although said gas mixing regulation device A5 is not provided. In such a case, said diluting inert gas supply path A3, cleaning gas supply path A4 and cleaning mixed gas introduction pipe A6 will be generically referred to as a gas introduction part. In a case where a cleaning mixed gas regulation device is provided in the aforementioned CVD device, said cleaning mixed gas introduction pipe will be generically referred to as a gas introduction part, and in a case where a cleaning mixed gas regulation device is not provided, the inert gas supply pipe and said cleaning gas supply pipe will be also generically referred to as a gas introduction part.

As the cleaning gas, there can be used nitrogen trifluoride ($NF_3$), hexafluoroethane ($C_2F_6$), chlorine trifluoride ($ClF_3$), tetrafluoromethane ($CF_4$), trifluoromethane ($CHF_3$), sulfur hexafluoride ($SF_6$), hydrogen chloride (HCl), chlorine ($Cl_2$) or the like. Such cleaning gas may be satisfactorily used as needed to clean a CVD device. In a case where nitrogen trifluoride ($NF_3$) is used, in addition, it is possible to remove silicon compounds such as silicon dioxide ($SiO_2$), polysilicon, metal silicide (for example, tungsten silicide (WSix)).

As the inert gas, there is preferably selected a gas having a boiling point lower than that of said cleaning gas. When nitrogen gas is used as the inert gas, it is relatively cheap and higher in general usability because its boiling point is lower than that of the various cleaning gases mentioned above. Of course, another suitable gas such as argon gas may also be used.

In place of said CVD device, the gas recovery unit according to the present invention may be applied to an etching device constructed such that after a mask is fitted, the masked surface of said substrate is etched by an etching gas. In addition, said etching device corresponds to the CVD device in FIG. 1 and the etching gas corresponds to the cleaning gas.

Said exhaust gas discharge pipe A7 and said discharge pipes B1, C1 will be generically referred to as an exhaust gas discharge part. In addition, a route extending between said exhaust gas recovery part and said exhaust gas purification part for recovering said cleaning gas (etching gas) which has been liquefied is not limited to the construction of the aforementioned embodiment, if it is constructed so as to recover the same liquefied cleaning gas (etching gas) for recycle use.

While the invention has been described with preferred embodiments, it is to be understood that variations and modifications may be resorted to as will be apparent to those skilled in the art. Such variations and modifications are to be considered within the purview and the scope of the claims appended hereto.

We claim:

1. A gas recovery unit which comprises:
    a CVD device with a gas introduction part having an inert gas supply path for supplying a diluting inert gas and a cleaning gas supply path for supplying a cleaning gas, each connected thereto, and which has an exhaust gas discharge part for releasing an exhaust gas; and
    an exhaust gas recovery part for cooling down and recovering said cleaning gas from said CVD device and an exhaust gas purification part for purifying the liquefied and recovered exhaust gas; characterized in that:
        said diluting inert gas is comprised of a gas having a boiling point lower than that of said cleaning gas,
    in that said exhaust gas recovery part is constructed so as to have an inert gas reservoir part capable of accommodating a cooling inert gas having a boiling point lower than that of said cleaning gas in a liquid state, to have an exhaust gas supply part for supplying said exhaust gas to said inert gas reservoir part so that it can be brought in gas-liquid contact with said cooling inert gas, and to have a recovered and liquefied gas discharge part for discharging the recovered and liquefied gas which has been liquefied in said inert gas reservoir part,
    in that said exhaust gas purification part is constructed so as to have a recovered and liquefied gas reception part provided for receiving the recovered and liquefied gas from said exhaust gas recovery part, to have an evaporator for evaporating said recovered and liquefied gas, a condenser for carrying out a heat exchange between the cooling inert gas in the liquid state consisting of the same composition as said diluting inert gas and said recovered and liquefied gas which has been evaporated, and cleaning gas recovery parts for recovering the cleaning gas which has been condensed in said condenser, and to have a cooling inert gas discharge part for discharging said cooling inert gas which has been evaporated;
    and in that the cooling inert gas discharge part is connected to said inert gas supply path.

2. A gas recovery unit, wherein an etching device is provided having a gas introduction part comprising an inert gas supply path for supplying a diluting inert gas and an etching gas supply path for supplying an etching gas, each connected thereto, and which has an exhaust gas discharge part for releasing an exhaust gas; and
    an exhaust gas recovery part for cooling down and recovering said etching gas from the exhaust gas from said etching device and an exhaust gas purification part for purifying the liquefied and recovered exhaust gas; and in which
    said diluting inert gas is comprised of a gas having a boiling point lower than that of said etching gas;
    said exhaust gas recovery part is constructed so as to have an inert gas reservoir part capable of accommodating a cooling inert gas having a boiling point lower than that of said etching gas in a liquid state, to have an exhaust gas supply part for supplying said exhaust gas to said inert gas reservoir part so that it can be brought in gas-liquid contact with said cooling inert gas, and to have a recovered and liquefied gas discharge part for discharging the recovered and liquefied gas which has been liquefied in said inert gas reservoir part;
    said exhaust gas purification part is constructed so as to have a recovered and liquefied gas reception part for receiving the recovered and liquefied gas from said exhaust gas recovery part, to have an evaporator for evaporating said recovered and liquefied gas, a condenser for carrying out a heat exchange between the cooling inert gas consisting of the same composition as said diluting inert gas and said recovered and liquefied gas which has been evaporated, and etching gas recovery parts for recovering the etching gas which has been condensed in said condenser, and to have a cooling inert gas discharge part for discharging said cooling inert gas which has been evaporated; and
    the cooling inert gas discharge part is connected to said inert gas supply path.

3. A gas recovery unit according to claim 1, in which a prepurification part for prerectifying said recovered and liquefied gas so that a miscellaneous gas having a boiling point lower than that of said cleaning gas or said etching gas is removed from the recovered and liquefied gas is provided in said exhaust gas purification part, and a miscellaneous gas discharge part for discharging said miscellaneous gas is provided in said prepurification part.

4. A gas recovery unit according to claim 2, in which a prepurification part for prerectifying said recovered and liquefied gas so that a miscellaneous gas having a boiling point lower than that of said cleaning gas or said etching gas is removed from the recovered and liquefied gas is provided in said exhaust gas purification part, and a miscellaneous gas discharge part for discharging said miscellaneous gas is provided in said prepurification part.

5. A gas recovery unit according to claim 3, in which a miscellaneous gas supply part for supplying said miscellaneous gas from said prepurification part so that it can be brought in gas-liquid contact with said cooling inert gas is provided in said exhaust gas recovery part.

6. A gas recovery unit according to claim 4, in which a miscellaneous gas supply part for supplying said miscellaneous gas from said prepurification part so that it can be brought in gas-liquid contact with said cooling inert gas is provided in said exhaust gas recovery part.

7. A gas recovery unit according to claim 1, in which said cleaning gas or said etching gas comprise at least one gas selected from the group consisting of nitrogen trifluoride ($NF_3$), hexafluoroethane ($C_2F_6$), chlorine trifluoride ($ClF_3$), tetrafluoromethane ($CF_4$), trifluoromethane ($CHF_3$), sulfur hexafluoride ($SF_6$), hydrogen chloride (HCl), chlorine ($Cl_2$), perfluoro compound gases (PFCs) and mixtures thereof.

8. A gas recovery unit according to claim 2, in which said cleaning gas or said etching gas comprise at least one gas selected from the group consisting of nitrogen trifluoride ($NF_3$), hexafluoroethane ($C_2F_6$), chlorine trifluoride ($ClF_3$), tetrafluoromethane ($CF_4$), trifluoromethane ($CHF_3$), sulfur hexafluoride ($SF_6$), hydrogen chloride (HCl), chlorine ($Cl_2$), perfluoro compound gases (PFCs) and mixtures thereof.

9. A gas recovery unit according to claim 1, in which said inert gas is nitrogen gas.

10. A gas recovery unit according to claim 2, in which said inert gas is nitrogen.

* * * * *